(12) United States Patent
Balluchi et al.

(10) Patent No.: US 9,384,830 B2
(45) Date of Patent: Jul. 5, 2016

(54) APPARATUSES AND METHODS FOR PERFORMING MULTIPLE MEMORY OPERATIONS

(71) Applicant: MICRON TECHNOLOGY, INC., Boise, ID (US)

(72) Inventors: Daniele Balluchi, Cernusco Sul Naviglio (IT); Corrado Villa, Sovico (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 14/270,944

(22) Filed: May 6, 2014

(65) Prior Publication Data
US 2015/0325288 A1    Nov. 12, 2015

(51) Int. Cl.
G11C 16/04    (2006.01)
G11C 13/00    (2006.01)
G11C 16/10    (2006.01)
G11C 16/26    (2006.01)

(52) U.S. Cl.
CPC .......... G11C 13/003 (2013.01); G11C 13/0004 (2013.01); G11C 13/0064 (2013.01); G11C 13/0097 (2013.01); G11C 16/10 (2013.01); G11C 16/26 (2013.01)

(58) Field of Classification Search
CPC ..... G11C 16/10; G11C 16/26; G11C 16/0438
USPC ........... 365/185.12, 203, 204, 233.11, 189.14
See application file for complete search history.

(56) References Cited

U.S. PATENT DOCUMENTS

| | | | |
|---|---|---|---|
| 6,240,040 B1 | 5/2001 | Akaogi et al. | |
| 6,788,611 B2 | 9/2004 | Hsu et al. | |
| 7,319,612 B2 | 1/2008 | Babb et al. | |
| 7,489,557 B2 | 2/2009 | Kim et al. | |
| 7,885,099 B2 | 2/2011 | Fackenthal et al. | |
| 8,258,848 B2 * | 9/2012 | Chen | 327/333 |
| 8,451,643 B2 * | 5/2013 | Kim | 365/148 |
| 2010/0110796 A1 | 5/2010 | Park et al. | |
| 2011/0035537 A1 | 2/2011 | Kwon | |
| 2012/0117317 A1 * | 5/2012 | Sheffler | G11C 7/22 711/103 |

OTHER PUBLICATIONS

JEDEC Standard, "Embedded Multimedia Card (e•MMC), Electrical Standard 4.51," *JEDEC Solid State Technology Association*, JESD84-B451 (revision ofv JESD84-B45, Jun. 2011), 264 pgs. (Jun. 2012).

Villa et al., "A 45nm 1Gb 1.8V Phase-Change Memory," *IEEE International Solid-State Circuits Conference (ISSCC)*, Session 14 / Non-Volatile Memory / 14.8, pp. 270-271 (2010).

* cited by examiner

*Primary Examiner* — Son Dinh
(74) *Attorney, Agent, or Firm* — Holland & Hart LLP

(57) ABSTRACT

The disclosed technology relates to a memory device configured to perform multiple access operations in response to a single command received through a memory controller and a method of performing the multiple access operations. In one aspect, the memory device includes a memory array comprising a plurality of memory cells and a memory controller. The memory controller is configured to receive a single command which specifies a plurality of memory access operations to be performed on the memory array. The memory controller is further configured to cause the specified plurality of memory access operations to be performed on the memory array.

26 Claims, 7 Drawing Sheets

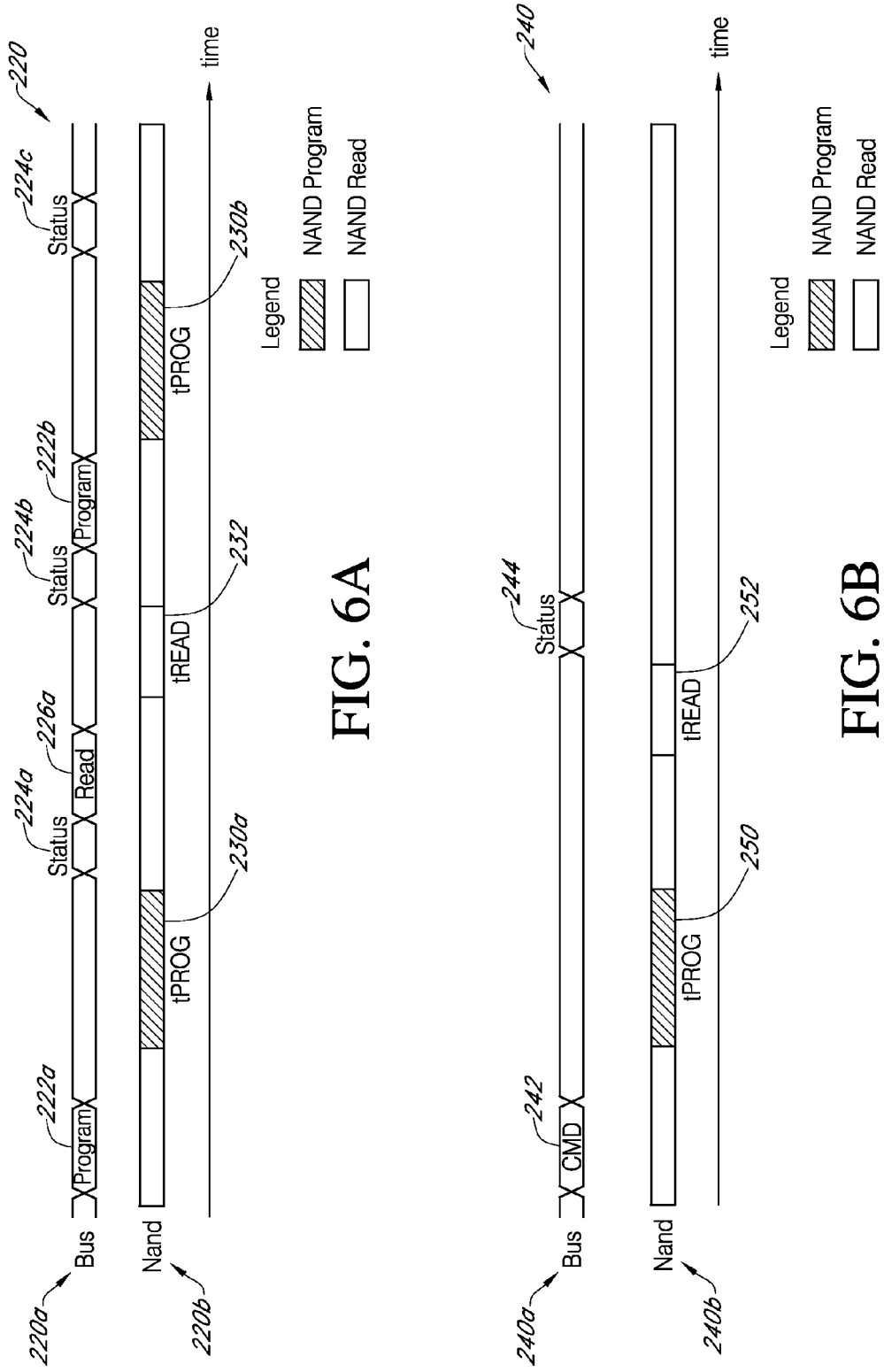

APPARATUSES AND METHODS FOR PERFORMING MULTIPLE MEMORY OPERATIONS

BACKGROUND

1. Field

Embodiments of the invention generally relate to a memory device and a method of operating the same, and more particularly to a memory device having a controller adapted to receive a single command and cause multiple access operations such as write or read operations to be performed on a memory array in response to the single command, and a method of using the same.

2. Description of the Related Art

In many nonvolatile memory technologies, a memory device has a controller configured to receive a command which specifies a memory access operation such as a read operation, a write operation or an erase operation to be performed on a memory array. The controller can further be configured to cause the memory access operation specified by the command to be performed on the memory array. It will be appreciated that overall time and energy associated with performing an access operation not only includes the time and energy that is directly involved in performing the access operation itself, but also includes certain overhead operations that may be performed prior to and subsequent to performing the access operation. Some overhead operations are performed each time the controller causes a memory access operation and can add significantly to the overall time and energy and shorten battery life. Thus, there is a need to reduce the overall time and energy associated with performing a memory access operation.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

FIG. 6A is an access timing diagram illustrating a plurality of memory access operations specified by a plurality of commands received by a controller.

FIG. 6B is an access timing diagram illustrating a plurality of memory access operations specified by a single command received by a controller according to one embodiment.

DETAILED DESCRIPTION OF EMBODIMENTS

In some nonvolatile memory technologies, a memory device has a controller configured to receive a command which specifies a memory access operation such as a read operation, a write operation or an erase operation to be performed on a memory array. The controller can further be configured to cause the memory access operation specified by the command to be performed on the memory array. It will be appreciated that the time and/or energy associated with performing an access operation not only includes the time and energy involved in performing the actual access operation, for example, by applying an access pulse such as a programming pulse or a read pulse on a memory cell, but also includes the time and energy involved in performing certain overhead operations. The overhead operations can include, for example, pre-charging certain rows and/or columns prior to applying the access pulse, and/or discharging certain rows and/or columns subsequent to applying the access pulse. In some technologies, these overhead operations such as pre-charging and discharging are performed each time a memory access operation is caused to be performed by the controller and can degrade overall time and/or energy efficiency of the memory device. For example, while the time it takes to change the state of a memory cell, such a phase change memory cell, can be from few nanoseconds to few microseconds, the overall time it takes to pre-charge certain rows and columns prior to applying a programming pulse can add significant overhead time and/or energy. The additional time and/or energy can depend, for example, on the resistances and capacitances of the columns and rows that may be pre-charged prior to the application of the access pulse. By performing multiple access operations for a given set of overhead functions, overall access time and energy can advantageously be decreased.

In the following, a memory device including a plurality of memory cells in a memory array is disclosed. The memory device includes a memory controller configured to receive a single command which specifies a plurality of memory access operations to be performed on the memory array, where each of the specified plurality of memory access operations of the single command comprises one of a write operation, an erase operation or a read operation. The memory controller is further configured to cause the specified plurality of memory access operations to be performed on the memory array in response to the single command. In operation, the memory device can decrease the time and/or energy associated with performing each of the specified access operations by not repeating certain overhead functions for each of the specified access operations.

Figure 1:
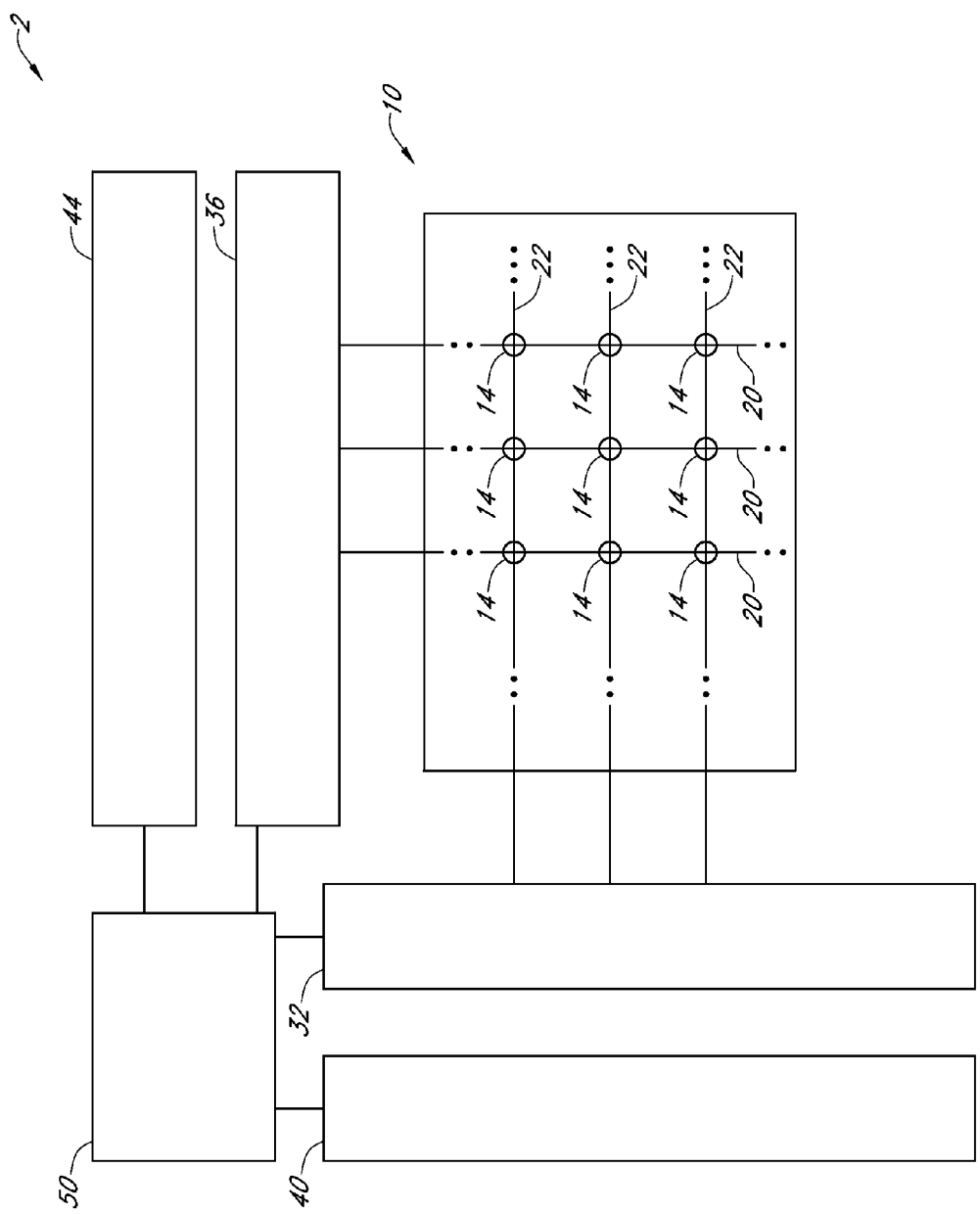
FIG. 1 is a schematic circuit block diagram of a memory device according to one embodiment.

FIG. 1 schematically illustrates a circuit block diagram of a memory device 2 according to some embodiments. The memory device 2 includes a memory array 10 which comprises a plurality of columns 20 and a plurality of rows 22. The memory array 10 additionally comprises a plurality of memory cells 14 at each crossing between a column 20 and a row 22. In some implementations, the columns 20 may also be referred to as bit lines or digit lines, and rows 22 may also be referred to as word lines. At least some of the memory cells 14 can be accessed by application of any suitable electrical signal, including, for example, voltage, current or electric field, among others. Each of the memory cells 14 may have an address defined by the row 22 and the column 20 coupled to the memory cell 14.

The memory device 2 additionally includes a column decoder 44 electrically connected to the columns 20 and a row decoder 40 electrically connected to the rows 22 according to some embodiments. In operation, a physical address of a memory cell 14 to be accessed may be specified by a memory cell address, which may be included in a memory access command. The memory cell address can include a column address and/or a row address corresponding to the column and the row to be activated in order to access a target memory cell. Upon receiving the memory cell address, the column decoder 44 is configured to decode a column address and select a column to be activated and the row decoder 40 is similarly configured to decode a row address and select a row to be activated.

The memory device 2 additionally includes a row driver 32, which can be a word line driver, electrically connected to the rows 22, and a sense amplifier 36 electrically connected to the columns 20. During an access operation, one of the rows 22 and one or more of the columns 20 specified by an address in a command are activated.

Still referring to FIG. 1, in some embodiments, the memory array 10 is further connected to a memory controller 50 configured to control the various access operations on the memory array 10, including write erase, and read. In operation, the memory controller 50 configured to receive signals from a processor to access one or more memory cells 14 in the memory array 10. The controller 50 is in turn configured to transmit control signals to the memory array 10 through the column decoder 44 and the row decoder 40. In some embodiments, the memory controller 50 is integrated as part of the memory device 2 in a solid-state integrated circuit. In other embodiments, the memory controller 50 can be part of a host device.

The memory array 10 comprises nonvolatile memory (NVM) cells 14. In some embodiments, the NVM cell 14 includes a storage element and a selector element that are electrically coupled or connected to each other. In some embodiments, the NVM cell 14 may include a selector element electrically coupled to a storage element. As used herein, a storage element refers to an element of the NVM cell 14 that can retain a physical state for an extended period, for example, greater than 1 year, without being refreshed or rewritten. As used herein, selector element refers to an element of the NVM cell 14 that can permit access to a storage element connected to the selector element under a certain condition, for example, when a voltage exceeds a threshold voltage.

Examples of a storage element include a floating gate of a dual-gate transistor, a phase change storage element, a resistance change random access memory (RRAM), a conductive bridge random access memory (CBRAM), and/or a spin transfer torque random access memory (STT-RAM), among other types of storage elements. Examples of a selector element include a two terminal selector device, such as a diode, an ovonic threshold switch (OTS), a tunnel junction, or a mixed ionic electronic conductor (MIEC), among other two terminal selector devices. Alternatively, the selector node may include a three terminal device, such as a field effect transistor (FET) or a bipolar junction transistor (BJT), among other switching elements.

Still referring to FIG. 1, the NVM cells 14 electrically coupled to the columns 20 and the rows 22 may be accessed by an access operation. As used herein, an access operation may refer to a write access operation, an erase access operation, or a read access operation.

In some embodiments, the NVM cells 14 include flash memory cells. In these embodiments, a write access operation may include increasing a threshold voltage of the flash memory cell by, for example, tunneling electrons from a channel region to a floating gate of the memory flash cells. On the other hand, an erase access operation may include decreasing a threshold voltage of the flash memory cell by, for example, tunneling electrons from the floating gate of the memory flash cells to the channel region. A read access operation may include detecting a drive current of the flash transistor at a read voltage and determining whether the flash memory cell has been written or erased.

In some embodiments, the NVM cells 14 include phase change memory (PCM) cells. As used herein, a PCM cell refers to an NVM cell which includes a storage element that can display different electrical resistances depending on the phase or phases of materials the storage element includes. In these embodiments, a write access operation, which for a PCM cell can also be referred to as a RESET operation, can change the resistance state of the memory cell from a relatively low resistance state (LRS) to a relatively high resistance state (HRS). The RESET operation can be achieved, for example, by applying a RESET current sufficient to melt at least a portion of a storage element comprising a chalcogenide material and quenching, such that at least a portion of the memory element becomes quenched-in in an amorphous phase, thereby resulting in the HRS. In addition, an erase operation, which for a PCM cell can also be referred to as a SET operation, changes the resistance state of the memory cell from an HRS to an LRS. The SET operation can be achieved, for example, by applying a SET current sufficient to crystallize at least a portion of a memory element comprising the chalcogenide material, such that a greater portion of the memory element becomes crystalline compared to the high resistance state.

Figure 2A:
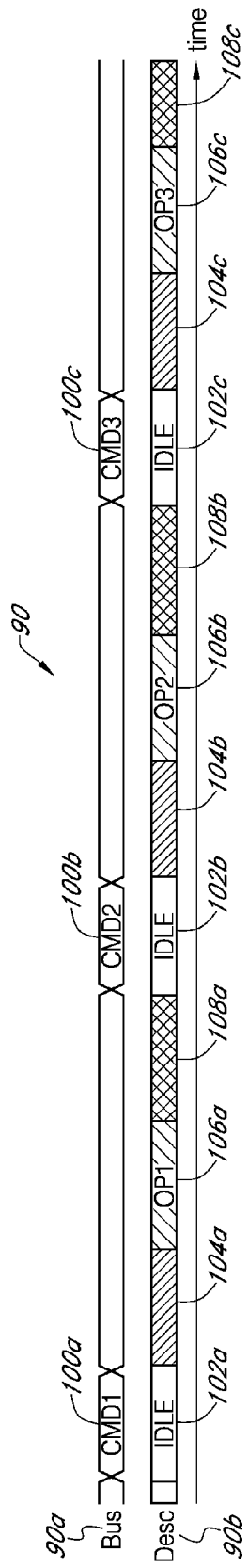
FIG. 2A is an access timing diagram illustrating a plurality of memory access operations specified by a plurality of commands received by a controller.

FIG. 2A is an access timing diagram 90 illustrating a command protocol for performing a plurality of memory access operations specified by a plurality of commands received by a memory controller. The command protocol of FIG. 2A can be implemented in a memory device similar to the memory device 2 described in FIG. 1, where the memory controller can be configured to receive a plurality of commands, each of which specifies a memory access operation to be initiated on the memory array, where each of the specified memory access operations includes one of a write operation or a read operation.

Still referring to FIG. 2A, the access timing diagram 90 illustrates a BUS time line 90a showing first, second and third commands, (CMD1) 100a, (CMD2) 100b, and (CMD3) 100c. While for clarity and simplicity of illustration, first through third commands 100a-100c and the corresponding operations are illustrated, it will be understood that any number of commands and the corresponding operations can be illustrated in a similar manner. The access timing diagram 90 also illustrates a descriptor line 90b illustrating first, second and third memory access operations (OP1) 106a, (OP2) 106b and (OP3) 106c that follow first, second and third idles (IDLE) 102a, 102b and 102c. The first to third memory access operations 106a-106c are triggered by the first to third commands 100a-100c. The descriptor line 90b additionally illustrates a first, second and third pre-access operations 104a, 104b and 104c to be performed on the memory array prior to the first, second and third memory access operations 106a, 106b and 106c, respectively. The descriptor line 90b additionally illustrates a first, second and third post-access operations 108a, 108b and 108c to be performed on the memory array subsequent to the first, second and third memory access operations 106a, 106b and 106c, respectively.

In some embodiments, the first, second and third pre-access operations 104a, 104b and 104c can include, for example, a pre-charging operation performed on a plurality of rows connected to a row decoder from an initial voltage to a pre-charge voltage. The pre-charging operations are followed by first to third access operations 106a-106c performed on first to third memory cells. Each of the first to third access operations include applying first to third access pulses to the respective rows of the plurality of rows corresponding to the memory cells to be accessed. In addition, in some embodiments, the first, second and third post-access operations 108a, 108b and 108c can include, for example, a discharging operation performed on the plurality of rows connected to the row decoder from the pre-charge voltage back to the initial voltage.

Thus, as illustrated in illustrated FIG. 2A, for each of the three memory access operations (OP1) 106a, (OP2) 106b and (OP3) 106c performed in response to the three commands (CMD1) 100a, (CMD2) 100b and (CMD3) 100c, separate respective pre-access operations (for example, pre-charge operations) 104a, 104b and 104c and separate respective post-access operations (for example, discharge operations) 108a, 108b and 108c are performed.

Figure 2B:
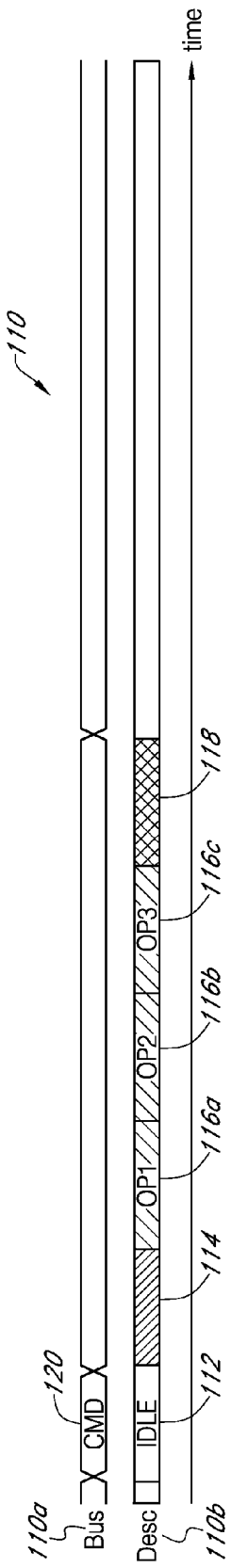
FIG. 2B is an access timing diagram illustrating a plurality of memory access operations specified by a single command received by a controller according to one embodiment.

FIG. 2B is an access timing diagram 110 illustrating a command protocol for performing a plurality access operations specified by a single command received by a memory controller according to some embodiments. The command protocol of FIG. 2B can be implemented in a memory device similar to that described in FIG. 1, including a memory array having a plurality of word lines and a memory controller, where the memory controller is configured to receive a single command which specifies plurality of memory access operations to be performed on the memory array. The command protocol can be further implemented in a memory device where the memory controller is further configured to initiate the specified plurality of memory access operations consecutively in response to the single of command, where each of the specified plurality of memory access operations of the single command include one of a write operation or a read operation.

Still referring to FIG. 2B, the access timing diagram 110 illustrates a BUS time line 110a showing a single commands (CMD) 120. The access timing diagram 110 also illustrates a descriptor line 110b describing plurality of access operations triggered by the single command and performed on the memory array. The descriptor line 110b illustrates, following an idle (IDLE) 112, the single command (CMD) 120 triggering a pre-access operation 114. In some embodiments, the pre-access operation 114 includes simultaneous pre-charging of a plurality of rows connected to a row decoder from an initial voltage to a pre-charge voltage. The pre-access operation 124 is followed by a plurality of memory access operations (OP1) 116a, (OP2) 116b and (OP3) 116c. While for clarity and simplicity of illustration, first through third operations 116a-116c are illustrated, it will be understood that the principles and advantages disclosed will be applicable to any number of operations. In some embodiments, performing the plurality of memory access operations includes accessing a first memory cell connected to a first row of the plurality of rows at a first access operation (OP1) 116a, accessing a second memory cell connected to a second row of the plurality of rows at a second access operation (OP2) 116b, and accessing a third memory cell connected to a third row of the plurality of rows at a third access operation (OP3) 116c. Each of the access operations can be performed by, for example, applying an access pulse to the rows connected to the respective memory cells. In some embodiments, the plurality of memory access operations (OP1) 116a, (OP2) 116b and (OP3) 116c are followed by a post-access operation 118. In some embodiments, the post-access operation 118 includes simultaneously discharging the plurality of rows connected to the row decoder from the pre-charge voltage back to the initial voltage at a single discharge operation.

Thus, in the illustrated embodiment in FIG. 2B, in contrast to FIG. 2A, for all of the three operations (OP1) 116a, (OP2) 116b and (OP3) 116c performed in response to the single command (CMD) 120, a pre-access operation 114, for example, a single pre-charge operation, and a single post-access operation 118, for example, a single discharge operation, are performed.

In some embodiments, the three operations (OP1) 116a, (OP2) 116b and 116c (OP3) may be performed on memory cells connected to different rows. In other embodiments, any two or more of the three operations may be performed on two or more memory cells connected to a shared row.

In some embodiments the three operations (OP1) 116a, (OP2) 116b and (OP3) 116c may include the same operation (i.e., one of write, erase, and read). In other embodiments, the three operations (OP1) 116a, (OP2) 116b and (OP3) 116c may be mixed and include different operations.

Figure 3:
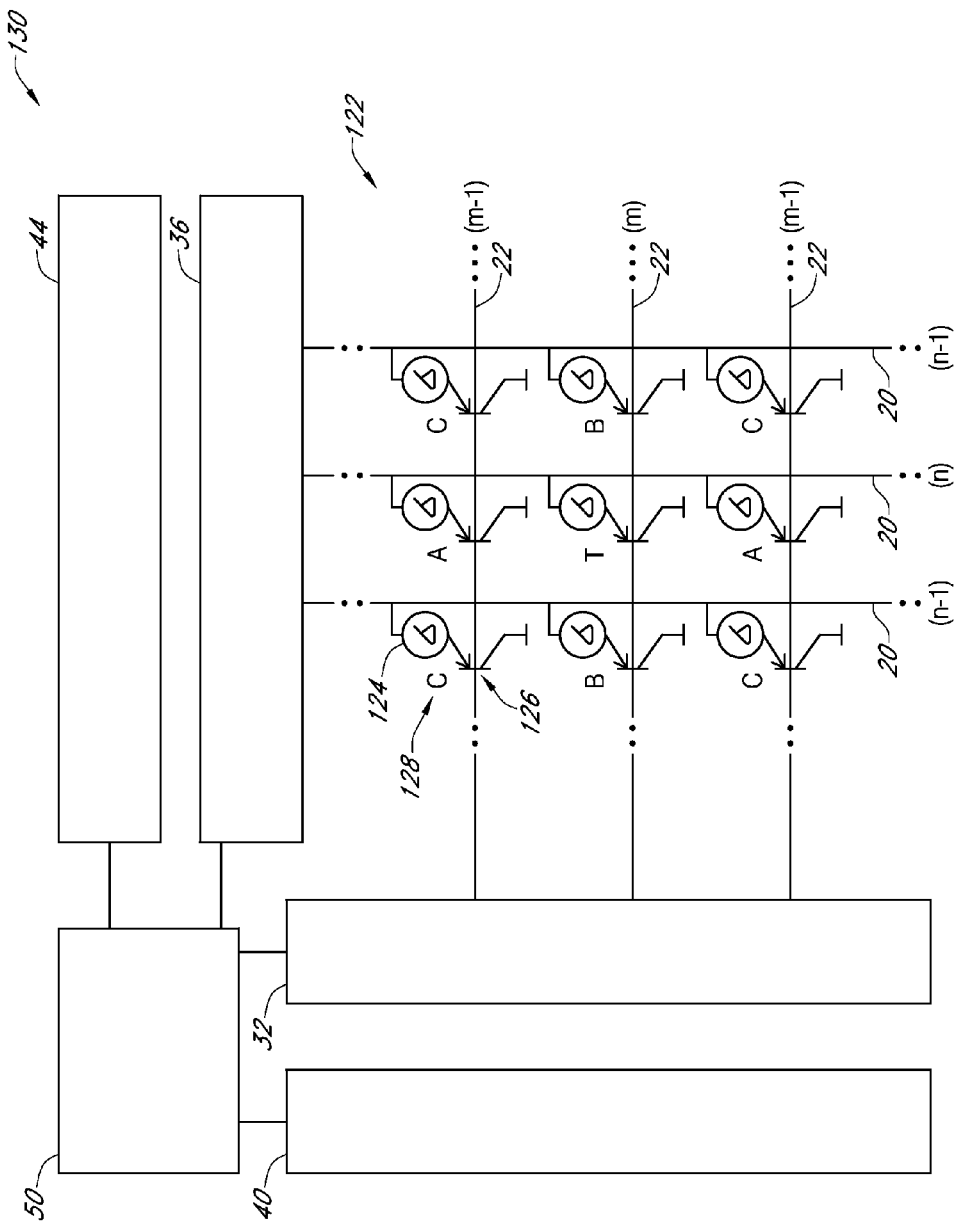
FIG. 3 is a schematic circuit diagram of a memory device including phase change memory cells according to one embodiment.
Figure 4A:
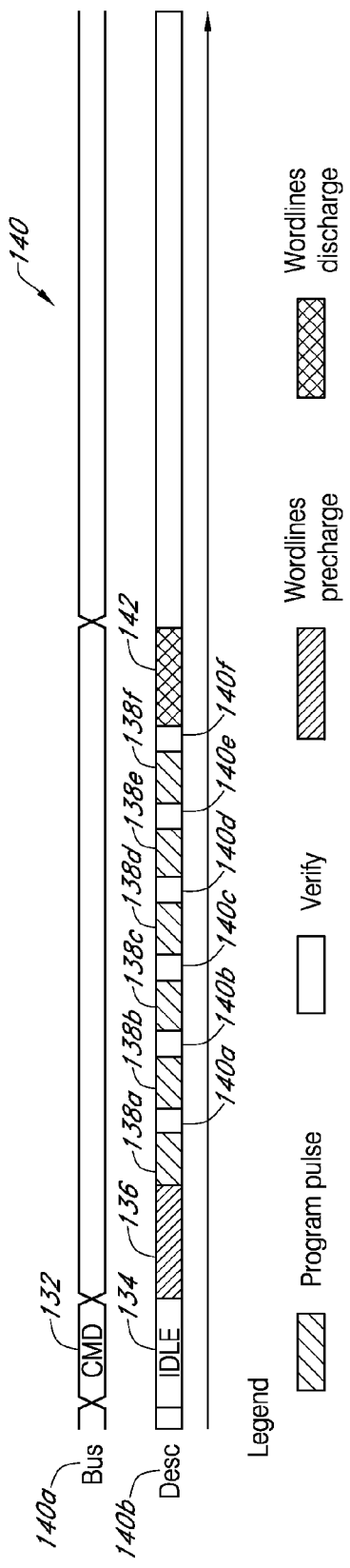
FIG. 4A is an access timing diagram illustrating a plurality of memory access operations specified by a single command received by a controller according to one embodiment.
Figure 4B:
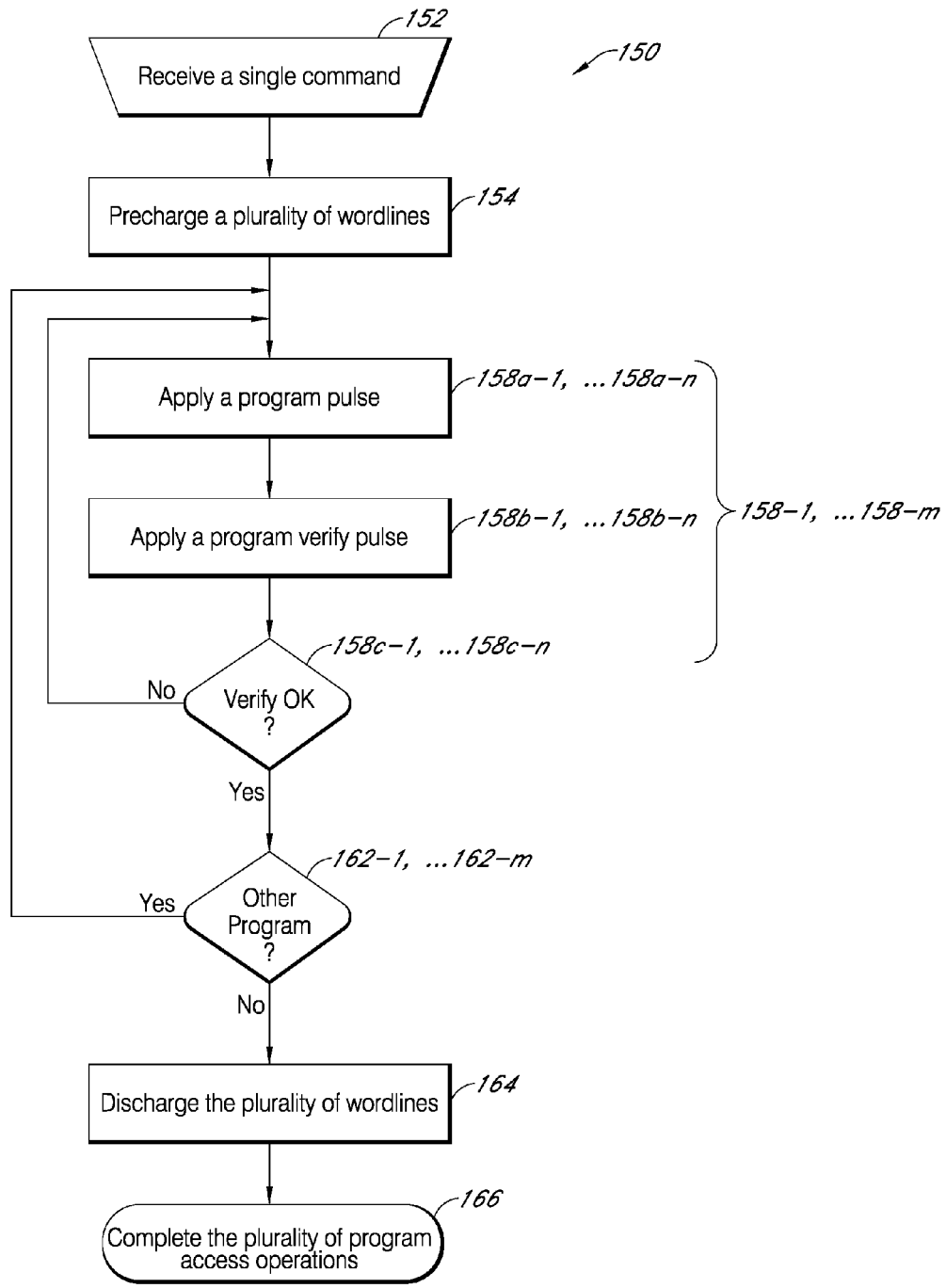
FIG. 4B is a flowchart depicting a method of performing a plurality of memory access operations specified by a single command received by a controller according to one embodiment.

In FIGS. 3 and 4A-4B, a memory device having a controller configured to cause a plurality access operations specified by a single command according to some embodiments and a method of using the memory device are disclosed, in the context of phase change memory. However, it will be appreciated that the embodiments disclosed herein can be generally applied to other types of memory technologies.

FIG. 3 is a schematic circuit diagram of a phase change memory (PCM) device 130 configured to combine memory operations according to one embodiment. Similar to the memory device 2 of FIG. 1, the PCM device 130 includes a column decoder 44 electrically connected to the columns 20 and a row decoder 40 electrically connected to the rows 22 according to some embodiments. Also similar to FIG. 1, the phase change memory device 130 additionally includes a row driver 32 electrically connected to the rows 22 and a sense amplifier 36 electrically connected to the columns 20. The memory device can be electrically connected to a memory controller 50 configured to receive signals from the processor to access one or more memory cells in a phase change memory (PCM) array 122. The controller 50 is in turn configured to transmit column and row control signals to the column and row decoders 44 and 40.

Still referring to FIG. 3, the PCM device 130 includes the PCM array 122 that is a "cross point" type array and includes a plurality of phase change memory (PCM) cells 128 disposed at intersections formed by the columns 20 connected to the sense amplifier 36 and the rows 22 connected to the row driver 32. In some embodiments, each of the PCM cells 128 may be individually accessed by uniquely biasing the column and the row whose intersection defines the each of the PCM cells 128. As used herein, a PCM cell 128 to be accessed may be referred to as a target (T) cell located at an intersection formed by a selected column 20-$n$ and selected row 22-$m$. The T cell may be accessed by applying an access signal across the T cell, where the access signal can include a write access signal, an erase access signal, or a read access signal. The access signal can be a voltage signal or a current signal, among other signals.

Generally in a "cross-point" type PCM array, one or more T cells can be accessed while inhibiting the remaining cells. This can be achieved, for example, by applying inhibit signals across the remaining cells that are substantially different from access signal applied to the T cells. Generally, for example, a selected column voltage $V_{COL\ SEL}$ can be applied to a selected column (20-$n$ in this example) while applying a selected row voltage $V_{ROW\ SEL}$ to a selected row (22-$m$ in this example). Concurrently, an inhibited column voltage $V_{COL\ INHIBIT}$ can be applied across the remaining columns and an inhibited row voltage $V_{Row\ INHIBIT}$ can be applied across the remaining rows. Under this configuration, when the bias between $V_{COL\ SEL}$ and $V_{ROW\ SEL}$ exceeds $V_{ACCESS}$, the target cell T can be accessed. In addition, a bias in magnitude of about a difference ($V_{COL\ SEL}$-$V_{ROW\ INHIBIT}$) is applied across inhibited cells along the selected column 20-$n$ (hereinafter, referred to as "A" cells). In addition, a bias in magnitude of about a difference ($V_{ROW\ SEL}$-$V_{COL\ INHIBIT}$) is applied across inhibited cells along the selected row 22-$m$ (hereinafter, referred to as "B" cells). In addition, a bias in magnitude of about a difference ($V_{COL\ INHIBIT}$-$V_{ROW\ INHIBIT}$) is applied across the remaining inhibited cells across inhibited rows and inhibited columns (hereinafter referred to as "C" cells).

In the illustrated embodiment of FIG. 3, each PCM cell 128 includes a chalcogenide storage element 124. In some embodiments, each PCM cell 128 may include a heater and a storage element 124 formed of a chalcogenide material such as an alloy based on the Ge—Se—Te (GST) alloy system. In addition, each PCM cell 128 includes a selector 126, which includes a bipolar junction transistor (BJT) in the illustrated embodiment of FIG. 3. In FIG. 3, the illustrated selector 126 is a PNP BJT. However, in alternative embodiments, the selector can include an NPN BJT or a diode. In FIG. 3, the storage elements 124 of the PCM cells 128 are connected along columns 20 (for example, bit lines). In addition, the base contacts of the PNP BJT 126 are connected along rows 22 (for example, word lines).

FIG. 4A is an access timing diagram 140 illustrating a command protocol for performing a plurality access operations specified by a single command received by a memory controller according to some embodiments. The command protocol of FIG. 4A can be implemented in a PCM memory device similar to that described in FIG. 3, comprising a memory array and a memory controller configured to receive the single command which specifies the plurality of memory access operations. It will be appreciated that while the access timing diagram 140 illustrates a plurality of program operations, which can refer to RESET operations that change the resistance of a PCM cell from LRS to HRS, the method described herein is not so limited and can similarly be implemented in performing a plurality of read operations and/or erase operations, which can refer to SET operations that change the resistance of a PCM cell from HRS to LRS.

Still referring to FIG. 4A, the access timing diagram 140 illustrates a BUS time line 140$a$ showing a single command (CMD) 132 which specifies a plurality of memory access operations to be performed on the memory array. The access timing diagram 140 additionally illustrates a descriptor line 140$b$ describing the plurality of memory access operations triggered by the single command (CMD) 132. The descriptor line 130$b$ illustrates, following an idle (IDLE) 134, a single pre-charge operation 136 to simultaneously pre-charge a plurality of rows from an initial voltage to a pre-charge voltage. The pre-charge operation 136 can comprise, for example, applying the inhibited column voltage $V_{Row\ INHIBIT}$ described in FIG. 3 to the plurality of rows. The single pre-charge operation 136 is followed by a plurality of access operations to be performed on a plurality of memory cells of the PCM array through application of an access pulse(s) (for example, a program pulse(s) 138$a$-138$f$), where each access operation is followed by a verify operation (140$a$-140$f$). For clarity and simplicity of illustration, the embodiment of FIG. 4A illustrates six access (for example, program) operations and the associated verify operations. However, the principles and advantages are applicable to any suitable number of access operations and the associated verify operations. In the illustrated embodiment, the plurality of access operations include first through sixth access (for example, program) operations 138$a$-138$f$, performed on first through sixth memory cells connected to first through sixth rows, where each of the first through sixth access operations 138$a$-138$f$ is followed by a respective first through sixth verify operations 140$a$-140$f$ performed on the first through sixth memory cells. The descriptor line 140$b$ further illustrates simultaneous discharging of the plurality of rows from the pre-charge voltage to the initial voltage after the sixth verify operation 140$f$ at a single discharge operation 142. The discharge operation 142 can comprise, for example, discharging the inhibited column voltage $V_{Row\ INHIBIT}$ described in FIG. 3 from the plurality of rows In summary, in the illustrated embodiment in FIG. 4A, for the plurality of access operations 138$a$-138$f$ to be performed on the memory array in response to the single command 132, only a single pre-charge operation 136 and a single discharge operation 142 are performed. Thus, compared to command protocols where a pre-charge operation and a discharge operation is performed for each access operation, time and/or energy savings can be realized in performing a plurality of access operations.

FIG. 4B is a flowchart depicting a method 150 of performing a plurality of program access operations specified by a single command received by a controller according to one embodiment. In particular, the method 150 can be implemented in a phase change memory device similar to comprising the PCM device 130 of FIG. 3 comprising the PCM array 122. However, it will be appreciated that the method can be implemented in other memory devices that include other types of arrays such as flash memory arrays. Furthermore, while the method 150 illustrates performing a plurality of program operations, the method can similarly be implemented in performing a plurality of read operations and/or erase operations.

The method 150 of performing the plurality of program access operations in response to the single command includes receiving 152 a single command which specifies the plurality of program access operations to be performed on the PCM array, using a memory controller. Upon receiving the single command, the method includes causing or initiating the specified plurality of memory access operations to be performed on the memory array in response to the single access command. In the flowchart of FIG. 4B, some reference characters have a "dash" followed by another reference character. Examples are 158-1 or 158-$m$. The character following the dash indicates the instance number for the one or more program access operations of the single command. For example, 158-1 indicates the first instance (first programming operation of the single command), and 158-$m$ indicates the m-th instance (m-th programming operation of the single command). The value of m is 2 or more.

Referring back to FIG. 3, during a standby mode, the PCM array 122 can be configured to have a standby biasing scheme where the rows (for example, word lines) 22 are pre-charged to a standby deselection voltage $V_{HX}$ which can be for example, about 1.2V, while the columns 20 are "soft-driven" or floated to an intermediate voltage between $V_{HX}$ and ground. Under this biasing scheme, no cell is selected, and the PNP BJTs 126 of the PCM cells 128 are reverse-biased such that the array leakage is reduced.

Then, still referring to FIG. 4B, upon receiving 152 the single command, the method 150 additionally includes pre-charging 154 the plurality of rows 22 from an initial voltage to a pre-charge voltage. For example, referring back to FIG. 3, the rows 22 can be pre-charged to a program deselection voltage $V_{HX\,PROG}$, which can be for example, about 5V, from the standby deselection voltage $V_{HX}$, which can be for example, about 1.2V. In addition, the columns 20 can be "soft-driven," or floated, to an intermediate voltage between $V_{HX\_PROG}$ and ground. Under this condition, no cell is selected and the PNP BJTs 146 of the PCM cells 130 are reverse-biased such that the array current leakage is reduced.

Still referring to FIG. 4B, after pre-charging 154 the plurality of word lines, the method 150 additionally includes performing 158-1 a first program access operation specified by the single command, which can includes applying 158a-1 a first program pulse(s) to a first selected PCM cell connected to a selected row. For example, referring back to FIG. 3, a target (T) PCM cell to be programmed can be selected by applying a selected row program voltage $V_{ROW\,SEL\,PROG}$ to a selected row 22-m, which can be about zero volts while biasing a selected column 20-n to $V_{COL\,SEL\,PROG}$, to about 5V. In addition, the remaining unselected rows 22-(m+1) and 22-(m−1) can be kept at the deselection voltage $V_{HX\,PROG}$, which can be about 5V, and the remaining unselected columns 20-(n−1) and 20-(n+1) can be kept "soft-driven" or floated at an intermediate voltage between the $V_{HX\_PROG}$ and ground. Under such program bias scheme, the PNP BJT 126 of the T PCM cell is forward biased such that a sufficient program current $I_{PROG}$ flows through the T PCM cell to switch the target (T) PCM cell from a low resistance state (LRS) to a high resistance state (HRS). In addition, under the program bias scheme, the PNP BJTs 146 of unselected "A" cells along the selected column 20-n are biased to near zero volts and can remain off. In addition, the PNP BJTs 146 of unselected "B" cells along the selected row 22-m are biased below the threshold voltages of the PNP BJTs 146 and also remain off. In addition, the PNP BJTs 146 of unselected "C" cells along the unselected rows 22-(m+1) and 22-(m+1) and along the unselected columns 20-(n−1) and 20-(n+1) are reverse-biased such that the array leakage is reduced.

Still referring to FIG. 4B, after applying 158a-1 the first program pulse(s) to the first selected PCM cell, the method 150 additionally includes applying 158b-1a first program verification pulse on the first selected PCM cell that has received the first program pulse to determine whether the resistance of the first selected PCM cell connected to the selected row has been raised to a desired resistance level. In some embodiments, the first verification pulse can be applied to the first selected row of the first selected PCM cell while keeping the voltage on the remainder of the rows substantially unchanged. For example, referring back to FIG. 3, the state of the target (T) PCM cell can be verified by applying a selected row verify voltage pulse $V_{ROW\,SEL\,VERIFY}$ to a selected row 22-m which can be, for example, about 0 volts and applying a selected column verify voltage $V_{COL\,SEE\,VERIFY}$ to a selected column 20-n, which can be, for example, about 1.2V. The remaining unselected rows 22-(m+1) and 22-(m−1) can remain pre-charged to a program deselection voltage $V_{HX}$ PROG which can be for example, about 5V, while the columns 20 are "soft-driven" or floated to an intermediate voltage between $V_{HX\,PROG}$ and ground. Under such a verification bias scheme, the PNP BJT 146 the T PCM cell is forward biased such that a verification current $I_{VERIFY}$ flowing through the T PCM cell can be sensed by the sense amplifier 36. In addition, under the verification bias scheme, the PNP BJTs 146 of unselected "A" cells along the selected column 20-n are reverse biased and can remain off. In addition, the PNP BJTs 146 of unselected "B" cells along the selected row 22-m can be biased below the threshold voltages of the PNP BJTs 146 to remain off. In addition, the PNP BJTs 146 of unselected "C" cells along the unselected rows 22-(m+1) and 22-(m+1) and along the unselected columns 20-(n−1) and 20-(n+1) are reverse-biased such that the array leakage is reduced.

Still referring to FIG. 4B, the method 150 additionally includes making a first verification 158c-1 of whether the first selected PCM cell has been programmed to a desired resistance level based on sensing a current detected between the selected row (for example, word line) and a selected column (for example, bit line) through the selected memory cell using a sense amplifier connected to the selected column. Upon determining that the first selected PCM cell has not been programmed to a desired resistance level, performing 158-1 the first program access operation additionally includes applying at 158a-2 to 158a-n one or more additional program pulses, applying 158b-2 to 158b-n additional respective program verification operations, and making additional respective verifications 158c-2 to 158c-n, until the first selected PCM cell has been programmed to a desired resistance level.

The method 150 additionally includes determining 162-1 whether one or more additional program access operations specified by the single command remains to be performed on a second PCM cell connected to a second one of the plurality of word lines corresponding to the single command.

Upon determining 162-1 that one or more additional program access operation specified by the single command remains to be performed, the method 150 additionally includes performing 158-2 to 158-m additional program access operations specified by the single command, which can include applying 158a-1 to 158a-n of an appropriate number program pulses, applying 158b-1 to 158b-n respective program verification operations, and making respective verifications 158c-1 to 158c-n of whether the additional selected PCM cells have been programmed to a desired resistance level, similar to as discussed above for the first selected PCM cell, After each performing 158-2 to 158-m a suitable number of additional program operations specified in the single command, each is followed by determining 162-2 to 162-m whether at least one additional memory access operations remains to be performed as specified by the single command.

It will be appreciated that in contrast to performing 158-1 the first program access operation, performing 158-2 to 158-m subsequent additional program access operations do not need to be preceded by pre-charging 154 of the plurality of rows, because the plurality of rows are not discharged until the program access operations 158-1 to 158-m specified by the single command have been performed.

Thus, after performing 158-1 to 158-m the plurality of program access operations in response to the single command and determining 162-m that no additional memory access operation specified by the single command remains to be performed, the method 150 proceeds to discharging 164 the plurality of rows from the program deselection voltage $V_{HX\,PROG}$, which can be for example, about 5V, back to the standby deselection voltage $V_{HX}$, which can be for example, about 1.2V. In addition, the columns 20 are "soft-driven" or floated to an intermediate voltage between the standby deselection voltage $V_{HX}$ and ground.

After discharging 164 the plurality of rows, the method 150 completes 166 the plurality of program access operations specified by the single command and returns the array to the standby mode, where no cell is selected and the PNP BJTs 146 of the PCM cells 130 are reverse-biased such that the array leakage is reduced. Thus, by using the method 150, the plurality of rows can be pre-charged and discharged advantageously only once prior to and subsequent to performing the plurality program access operations instead of pre-charging and a discharging the plurality of rows for each program access operation, thereby reducing the time and energy associated with the pre-charging and the discharging of the rows.

In the embodiments described in FIGS. 4A and 4B, the memory controller is configured to cause a program verification pulse to be applied to a PCM cell after causing a memory access (for example, program) pulse to be applied to the PCM cell for the plurality of memory access (for example, program) operations. However, in other embodiments (not illustrated), the memory controller can be configured to cause a plurality of program verification pulses to be applied to the respective plurality of PCM cells after causing a plurality memory access (for example, program) pulses to be applied to the first PCM cell.

Figure 5:
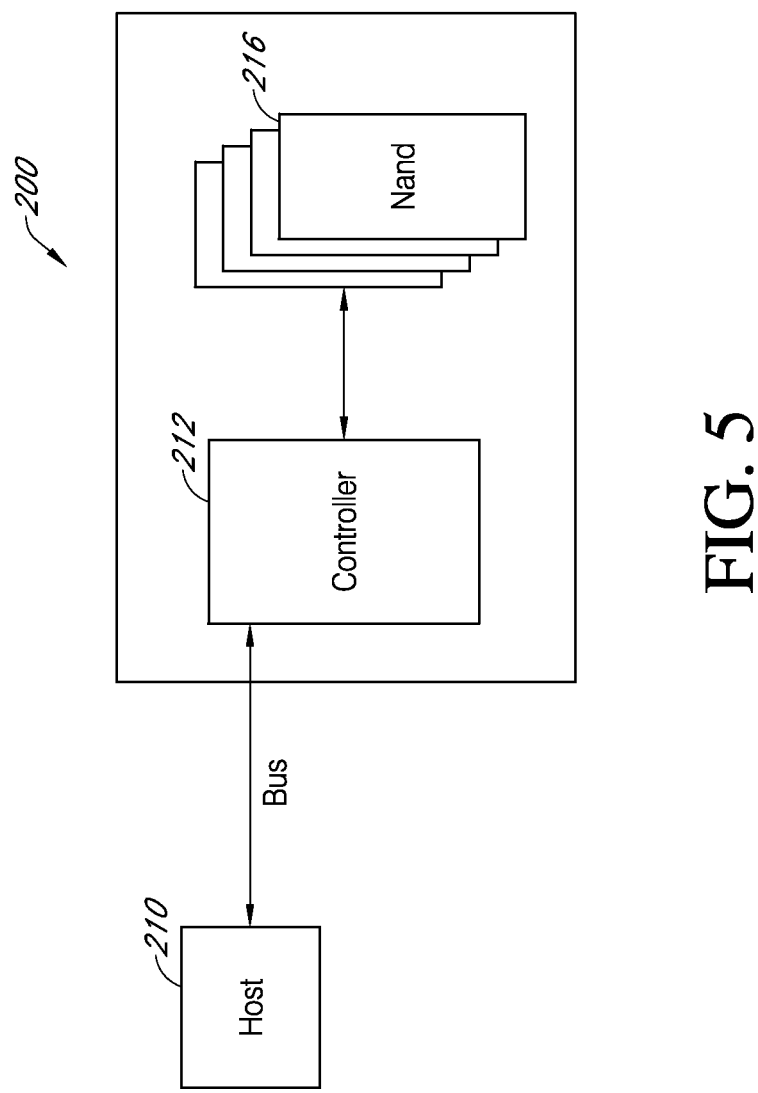
FIG. 5 is a schematic block diagram of a memory device including NAND memory arrays according to one embodiment.

FIG. 5 is a schematic block diagram of a managed memory device 200 including at least one memory device array 216 and a controller 212, where the controller 212 is configured to cause a plurality of access operations to be performed on at least one memory device array 216 in response to a single command received from a host device 210, according to another embodiment. The at least one memory device array 216 of the managed memory device 200 can include, in addition to a memory array, an embedded controller, a row decoder and a column decoder, among other supporting circuitry. The memory device array 216 can be configured, for example, similarly as described above in FIG. 1.

In one embodiment, the managed memory device 200 of FIG. 5 comprises an embedded multi-media card (eMMC) device in which the at least one memory device array 216 includes a NAND flash array, and the controller 212 is included in the managed memory device 200 in a single packaged die. In one embodiment, the managed memory device 200 including the eMMC device can have an external serial interface. The external serial interface can have up to 400 Mbytes/sec in bandwidth, for example.

Generally, in a NAND flash memory array, a write operation or a read operation are performed at a "page" level. A page can include a plurality of memory cells connected to a single word line. The number of memory cells in a page and the size of a page can vary in a very broad range.

FIG. 6A is an access timing diagram 220 illustrating a command protocol for performing a plurality access operations in response to a plurality of commands in a memory device, such as a conventional NAND flash memory device. The command protocol of FIG. 6A can be implemented in a conventional NAND flash memory device, which includes a memory array, which may be connected to a memory controller configured to receive and cause the plurality of commands, each of which specifies one memory access operation to be initiated by the memory controller. The memory controller can be further configured to initiate the specified one memory access operation in response to the each of the plurality of commands, where each of the specified memory access operations comprises one of a write operation or a read operation.

Still referring to FIG. 6A, the access timing diagram 220 illustrates a memory device BUS time line 220a showing a first program command 222a which specifies a first program operation 230a, a first status 224a following the first program command 222a, a first read command 226a which specifies a first read operation 232 immediately following the first status 224a, a second status 224b following the first read command 226a, a second program command 222b which specifies a second program operation 230b immediately following the second status 224b, and a third status 224c. Each of the first program command 222a, the first read program 226a, and the second program command 222b can specify respective single access operations that do not exceed a page size. By way of illustration, for a page size of 16 Kbytes, each of the first program command 222a, the first read command 226a and the second program command 222b can each specify accessing 4 Kbytes of memory.

The access timing diagram 220 also illustrates a description line 220b describing the plurality of access operations triggered by the plurality of commands and performed on the NAND flash memory array. The description line 220b illustrates the first program operation 230a on a first page of the NAND flash array that is triggered by the first program command 222a. Subsequently, the description line 220b illustrates the first read operation 232 performed on the NAND flash array that is triggered by the first read command 226a. The first read operation 232 can be performed on the first page or a second page different from the first page. Subsequently, the description line 220b illustrates the second program operation 230b performed on the NAND flash array that is triggered by the second program command 222b. The second program operation 230b can be performed on the first page, the second page different from the first page, or a third page different from the first and second page. By way of illustration, for a page size of 16 Kbytes, each of the first program operation 230a, the first read operation 232 and the second program operation 230b can each access 4 Kbytes of memory in response to the respective one of the plurality of access commands.

FIG. 6B is an access timing diagram 240 illustrating a command protocol for performing a plurality access operations in response to a single command on a memory device including a NAND flash memory array and a controller, according to some embodiments. The command protocol of FIG. 6B can be implemented in a memory device similar to the managed memory device 200 described above in FIG. 5, including a memory device 216 having a memory array and a memory controller 212 configured to receive the single command and initiate a plurality of memory access operations to be performed on the memory array. The memory controller is further configured to initiate the specified plurality of memory access operation in response to the single command, where each of the specified memory access operations comprises one of a write operation or a read operation.

Still referring to FIG. 6B, the access timing diagram 240 illustrates a managed memory BUS time line 240a showing a single command 242 and a single cumulative status 244 following the single command 242. It will be appreciated that unlike the memory BUS time line 220a in FIG. 6A which can correspond to a conventional memory device, the managed memory BUS time line 240a in FIG. 6A corresponds to a managed memory device similar to the managed memory device 216 of FIG. 5, which can include, in addition to a memory array, an embedded controller, a row decoder and a column decoder, among other supporting circuitry, as described above. The single command 242 can specify, for example, a plurality of program access operations 250 and a plurality of read access operation 252.

The access timing diagram 240 also illustrates a description line 240b describing a plurality of access operations triggered by the single command 242 and performed on the NAND flash memory array. The description line 240b illustrates the plurality of program access operations 250 and the plurality of read access operations 252 performed the on the NAND flash array that is triggered by the single command 242. It will be appreciated that the single command 242 is sent to the managed memory, while the access operations themselves are performed on the NAND flash array. Similar to FIG. 6A, each access operation specified in the single command may not exceed a page size. By way of an illustration, for a page size of 16 Kbytes, the single command 242 can specify a plurality of program access operations 250 including first and second program access operations to program 4 Kbytes each and a plurality of read access operations 252 including a read operation to read 4 Kbytes. In response to the single command, the controller can cause the first and second program access operations to be combined as an 8 Kbyte program operation and performed on a single page and cause the read access operation to be performed on the specified page. Thus, compared to FIG. 6A, by specifying a plurality of operations to be performed on the memory array in a single command, additional overhead of providing, for example, multiple statuses and pre-charging a word line multiple times to write to a single page, can be avoided.

As described above, a method of performing a plurality of memory operations using a single command can be implemented in various contexts. In the following, example structures of the single command are described according to embodiments.

TABLE 1 describes examples of information that may be included in an Operation Parameter List of the single command according to embodiments. The Operation Parameter List includes a Parameter List Header and a plurality (first to last) of Operation Descriptors. The Parameter List Header contains information that is common to all operations specified in the single command. In addition, the Operation Descriptor contains the details of each operation.

TABLE 1

Operation Parameter List

| Byte | Description |
|---|---|
| 0 | Parameter List Header |
| ... | |
| $m_H - 1$ | |
| $m_H$ | Operation Descriptor (first) |
| ... | |
| $m_H + k_1 - 1$ | |
| ... | ... |
| $n - k_L$ | Operation Descriptor (last) |
| ... | |
| $n - 1$ | |

TABLE 2 describes examples of information that may be included in a Parameter List Header according to embodiments. The Parameter List Header can include a Parameter List Length, an Operation Type, a Number of Operations, a Base Address and Flags. The Parameter List Length field specifies a length of the Operation Parameter List. The Operation Type field identifies the type (i.e., program, erase, read) operation to be performed on the memory array by the memory device. The Number of Operations field specifies the number of Operation Descriptors that will follow the Parameter List Header. The number of Operation Descriptors corresponds to the number of the plurality of operations to be performed on the memory array. The Base Address field contains the base address of the operations specified in each of the plurality of Operation Descriptors.

The Flags field may contain several types of information. For example, the Flags field may specify a particular order of execution of the plurality of operations specified in the Operation Descriptors. In particular, the Flags field may specify that the plurality of operations is to be performed in the order listed in the Operation Descriptors, or alternatively in an order different from the order listed in the Operation Descriptors. Other types of information that may be included in the Flags field include status format (for example, common or by operation), command options, etc.

TABLE 2

Parameter List Header

| Byte | Description |
|---|---|
| ... | Parameter List Length |
| ... | Operation Type |
| ... | Number of Operations |
| ... | Base Address |
| ... | Flags |

TABLE 3 describes examples of information that may be included in an Operation Descriptor according embodiments. The Operation Descriptor may include a Data Descriptor Length, an Operation Type, an Operation Tag, an Address, a Data Length, and/or a plurality of Data ($0^{th}$ to (n−1)th). The Descriptor Length field specifies the length of the Operation Descriptor. The Operation Type field specifies the type of operation to be performed on the memory array (for example read, program, erase, etc.) by the memory device. The Operation Type field can be omitted in some implementations, for example, if similar information is provided in Parameter List Header, or elsewhere. The Operation Tag field identifies each particular Operation Descriptor. When present, each Operation Descriptor in an Operation Parameter List has a unique value. The Address field contains the start address of the operation. The Data Length field specifies the amount of data bytes involved in the operation. For example, a Data Length having a value of zero specifies that no data is transferred to the device, which is not considered an error. The Length field may be omitted in some implementations, for example, if the operation does not invoke data transfer. The last portion of the Operation Descriptor contains a plurality of Data ($0^{th}$ to (n−1) th) that may be transferred from the host to the memory device. The Data field can be omitted in some implementations, for example if Length field is set to zero, or the operation type specified in the Operation Type does not include transferring data to the device.

TABLE 3

Operation Descriptor

| Byte | Description |
|---|---|
| 0 | Descriptor Length |
| ... | |
| $k_L - 1$ | |
| $k_L$ | Operation Type |
| ... | |
| $k_L + k_P - 1$ | |
| $k_L + k_P$ | Operation Tag |
| ... | |
| $k_L + k_P + k_T - 1$ | |
| $k_L + k_P + k_T$ | Address |
| ... | |
| $k_L + k_P + k_T + k_A - 1$ | |

TABLE 3-continued

| Byte | Description |
|---|---|
| $k_L + k_P + k_T + k_A$ | Data Length |
| ... | |
| $k_L + k_P + k_T + k_A + k_N - 1$ | |
| $k_L + k_P + k_T + k_A + k_N$ | Data(0) |
| ... | ... |
| $k_L + k_P + k_T + k_A + k_N + n - 1$ | Data(n-1) |

Operation Descriptor

TABLE 4 describes examples of information that may be included in a Data Descriptor where the operation to be performed on the memory array includes a request to transfer data from the device to the host, according embodiments. The Data Descriptor may include Data Descriptor Length, an Operation Type, a Data Length, and/or a plurality of Data ($0^{th}$ to (n−1)th). The Data Descriptor Length field specifies the length of the Data Descriptor. The Operation Type field can correspond to the value received in the request. The Operation Tag field identifies the particular Operation Descriptor in the Operation Parameter List for which the data to be transferred is related. The Data Length field specifies the amount of data (for example, in bytes) included in the Data Descriptor Still referring to TABLE 4, in some embodiments, the memory device is configured to transfer the data associated with the Operation Parameter List in a single packet, where the data related to each Operation Descriptor are appended sequentially in the order listed in the Operation Parameter List. In other embodiments, the memory device is configured to wrap the data in a structure similar to the structure described in the Operation Parameter List. In other embodiments, the memory device is configured to transfer the data associated with the Operation Parameter List in multiple packets.

TABLE 4

Data Descriptor

| Byte | Description |
|---|---|
| 0 | Descriptor Length |
| ... | |
| $k_L - 1$ | |
| $k_L$ | Operation Type |
| ... | |
| $k_L + k_P - 1$ | |
| $k_L + k_P$ | Operation Tag |
| ... | |
| $k_L + k_P + k_T - 1$ | |
| $k_L + k_P + k_T$ | Data Length |
| ... | |
| $k_L + k_P + k_T + k_N - 1$ | |
| $k_L + k_P + k_T + k_N$ | Data(0) |
| ... | ... |
| $k_L + k_P + k_T + k_N + n - 1$ | Data(n-1) |

Referring back to TABLE 3, in some embodiments, where the Operation Descriptor specifies operations that include data transfer from the host to the device, the Operation Descriptor may specify the Data Length corresponding to the data to be transferred. Then, the data may be transferred in a separated phase, after the command, with a Data Descriptor structure similar to that described above in TABLE 4.

TABLE 5 describes examples of information that may be included in a Status Descriptor, according embodiments. The Status Descriptor may include a Status Descriptor Length, an Operation Type, an Operation Tag, and a Status. The Status Descriptor Length field specifies the length of the Status Data Descriptor. The Operation Type field has a value that can correspond to the value received in the request in the Operation Parameter List. The Operation Tag field identifies the Operation Descriptor to which the data is related.

The memory device may provide a cumulative status of the operation specified in the Operation Parameter List. The status will indicate a "success" if the operations specified in the Operation Parameter list are successfully completed. Alternatively, the device may provide a status for each operation specified in a Operation Parameter List using the Operation Tag to identify each operation.

TABLE 5

Status Descriptor

| Byte | Descriptor |
|---|---|
| 0 | Status Descriptor Length |
| ... | |
| $k_L - 1$ | |
| $k_L$ | Operation Type |
| ... | |
| $k_L + k_P - 1$ | |
| $k_L + k_P$ | Operation Tag |
| ... | |
| $k_L + k_P + k_T - 1$ | |
| $k_L + k_P + k_T$ | Status |
| ... | |
| $k_L + k_P + k_T + k_S - 1$ | |

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a memory array comprising a plurality of memory cells; and
   a memory controller configured to:
   receive a single command which specifies a plurality of memory access operations to be performed on the memory array, wherein each of the plurality of memory access operations specified in the single command comprises one of a program operation or a read operation, and
   cause the specified plurality of memory access operations to be performed on the memory array by causing a plurality of word lines of the memory array to be pre-charged from an initial voltage to a pre-charge voltage, causing a first memory access operation to be performed, causing a second memory access operation to performed, and causing the plurality of word lines to be discharged to the initial voltage.

2. An apparatus comprising:
   a memory array comprising a plurality of phase change memory (PCM) cells; and
   a memory controller configured to:
   receive a single command which specifies a plurality of memory access operations to be performed on the memory array, wherein each of the plurality of memory access operations specified in the single command comprises one of a program operation or a read operation; and the memory controller is further configured to cause the specified plurality of memory access operations by:

causing a plurality of word lines of the memory array to be pre-charged from an initial voltage to a pre-charge voltage;

causing a first memory access pulse to be applied to a first PCM cell connected to one of the plurality of word lines such that a first memory access operation is performed;

causing a second memory access pulse to be applied to a second PCM cell connected to one of the plurality of word lines such that a second memory access operation is performed; and causing the plurality of word lines to be discharged to the initial voltage.

3. The apparatus of claim 2, wherein the first PCM cell and the second PCM cell are connected to a same word line of the memory array and are connected to different columns of the memory array.

4. The apparatus of claim 2, wherein the memory controller is further configured to cause the first memory access pulse to be applied and to cause the second memory access pulse to be applied without causing the plurality of word lines to be discharged between the first and second memory access pulses.

5. The apparatus of claim 2, wherein the first memory access pulse comprises one of a SET pulse or a RESET pulse, and wherein the second memory access pulse comprises the same one of the SET pulse or the RESET pulse as the first memory access pulse.

6. The apparatus of claim 2, wherein the first memory access pulse comprises one of a SET pulse or a RESET pulse, and wherein the second memory access pulse comprises a different one of the SET pulse or the RESET pulse as the first memory access pulse.

7. The apparatus of claim 5, wherein the memory controller is further configured to:

cause a first program verification pulse to be applied to the first PCM cell after causing the first memory access pulse to be applied to the first PCM cell; and cause a second program verification pulse to be applied to the second PCM cell after causing the second memory access pulse to be applied to the second PCM cell.

8. The apparatus of claim 7, wherein causing a memory access pulse and subsequently causing a verification pulse include keeping a word line voltage substantially constant.

9. The apparatus of claim 5, wherein the memory controller is further configured to:

cause first and second program verification pulses to be applied to the respective first and second PCM cells after causing the first and second memory access pulse to be applied to the first PCM cell.

10. The apparatus of claim 2, wherein one of the first and second memory access pulses comprises one of a SET pulse or a RESET pulse and another one of the first and second memory access pulses comprises a read pulse.

11. An apparatus comprising:

a managed memory device comprising a plurality of flash memory devices; and a memory controller configured to:

receive a single command which specifies a plurality of memory access operations to be performed on the managed memory device;

combine a first memory access operation and a second memory access operation of the plurality of memory access operations to be performed on a same page of the managed memory device; and cause the specified plurality of memory access operations and the combined first and second memory access operations to be performed on the managed memory device, wherein each of the plurality of memory access operations specified in the single command comprises one of a write operation or a read operation.

12. The apparatus of claim 11, wherein the memory controller is integrated with the plurality of flash memory devices in a single package.

13. An apparatus comprising:

a managed memory device comprising a plurality of memory devices; and a memory controller configured to:

receive a single command which specifies a plurality of memory access operations to be performed on the memory devices, and cause the specified plurality of memory access operations to be performed on the memory devices, wherein each of the plurality of memory access operations specified in the single command comprises one of a write operation or a read operation, wherein each of the memory devices comprises a plurality of pages of flash memory cells, wherein each page of flash memory cells comprises a plurality of flash memory cells connected to a common word line, wherein the single command specifies a first memory operation and a second memory operation, wherein the second memory operation comprises a different one of a program operation or a read operation from the first memory operation, and wherein the memory controller is further configured to cause the specified plurality of memory access operations by:

causing the first memory access operation to be performed on a fraction of a page of flash memory cells, and causing the second memory access operation to be performed on a fraction of a page of flash memory cells.

14. The apparatus of claim 13, wherein the single command further specifies a third memory operation of a type that is the same as one of the first or second memory operations, wherein the memory controller is further configured to cause the third memory access operation to be performed on a fraction of a page of flash memory cells, and wherein the memory controller is further configured to cause the third memory access operation and the one of the first and second memory operations that is the same as the third memory access operation to be performed sequentially on the same page.

15. An electronically-implemented method of accessing a memory array comprising a plurality of memory cells, the method comprising:

receiving a single command that specifies a plurality of memory access operations to be performed on the memory array; and performing the specified plurality of memory access operations on the memory array, wherein each of the specified plurality of memory access operations of the single command comprises one of a program operation or a read operation, and wherein performing the specified plurality of memory access operations comprises:
   pre-charging a plurality of word lines of the memory array from an initial voltage to a pre-charge voltage;
   applying a first memory access pulse to a memory cell connected to one of the plurality of word lines;
   applying a second memory access pulse to a second memory cell connected to one of the plurality of word lines; and
   discharging the plurality of word lines to the initial voltage.

16. An electronically implemented method of accessing a memory array comprising a plurality of phase change memory (PCM) cells, the method comprising:
   receiving a single command that specifies a plurality of memory access operations to be performed on the memory array; and
   performing the specified plurality of memory access operations on the memory wherein each of the specified plurality of memory access operations of the single command comprises one of a program operation or a read operation,
   wherein the memory array comprises a plurality of phase change memory (PCM) cells, and
   wherein performing the specified plurality of memory access operations comprises:
     pre-charging a plurality of word lines of the memory array from an initial voltage to a pre-charge voltage;
     applying a first memory access pulse to a first PCM cell connected to one of the plurality of word lines;
     applying a second memory access pulse to a second PCM cell connected to one of the plurality of word lines; and
     discharging the plurality of word lines to the initial voltage.

17. The method of claim 16, wherein the first PCM cell and the second PCM cell are connected to a same word line of the memory array and are connected to different columns of the memory array.

18. The method of claim 16, wherein the first and second memory access pulses are applied without discharging remaining ones of the plurality word lines between the first and second memory access pulses.

19. The method of claim 18, wherein first and second memory access pulses each comprise a same one of a SET pulse or a RESET pulse.

20. The method of claim 19, wherein performing the specified plurality of memory access operations further comprises:
   applying a first program verification pulse to the first PCM cell after applying the first memory access pulse to the first PCM cell; and
   applying a second program verification pulse to the second PCM cell after applying the second memory access pulse to the second PCM cell.

21. The method of claim 15,
wherein the memory array comprises a plurality of pages of flash memory cells,
wherein each page of flash memory cells comprise a plurality of flash memory cells connected to a common word line,
wherein the single command specifies a first memory operation and a second memory operation different from the first memory operation, and
wherein performing the specified plurality of memory access operations comprises:
   performing the first memory access operation on a fraction of a page of flash memory cells, and
   performing the second memory access operation on a fraction of a page of flash memory cells.

22. The method of claim 21,
wherein the single command further specifies a third memory operation of a type that is the same as one of the first or second memory operations, and
wherein performing the specified plurality of memory access operations further comprises performing the third memory access operation on a fraction of the page on which the one of the first and second memory operations same as the third memory operation is performed on.

23. An apparatus comprising:
a memory array; and
a memory controller configured to cause a plurality of memory access operations on the memory array in response to a single command from a host,
wherein the single command specifies a list of consecutive operational descriptors specifying information related to each of the plurality of memory access operations to be caused on the memory array, and
wherein each of the multiple memory access operations of the single command comprises one of a write operation or a read operation.

24. The apparatus of claim 23, wherein the memory access operations comprise different ones of write or read operations.

25. The apparatus of claim 23, wherein the memory controller is further configured to generate a single status corresponding to the multiple memory access operations after causing the plurality of memory access operations.

26. The apparatus of claim 23, wherein the memory controller is configured to cause the multiple operations in an order that is different from an order in which the consecutive operational descriptors are specified in the single command.

* * * * *